(12) United States Patent
Laxmanan et al.

(10) Patent No.: US 9,171,259 B1
(45) Date of Patent: Oct. 27, 2015

(54) ENHANCING CLASSIFICATION AND PREDICTION USING PREDICTIVE MODELING

(71) Applicant: Bank of America Corporation, Charlotte, NC (US)

(72) Inventors: Kasilingam Basker Laxmanan, West Chester, PA (US); Yudong Chen, Greenwood Village, CO (US); Peng Song, Wilmington, DE (US)

(73) Assignee: Bank of America Corporation, Charlotte, NC (US)

( * ) Notice: Subject to any disclaimer, the term of this patent is extended or adjusted under 35 U.S.C. 154(b) by 0 days.

(21) Appl. No.: 14/594,600

(22) Filed: Jan. 12, 2015

(51) Int. Cl.
| | |
|---|---|
| G06F 15/18 | (2006.01) |
| G06N 5/02 | (2006.01) |
| G06N 99/00 | (2010.01) |
| G06F 17/50 | (2006.01) |

(52) U.S. Cl.
CPC ............... *G06N 5/022* (2013.01); *G06F 17/50* (2013.01); *G06N 99/005* (2013.01)

(58) Field of Classification Search
None
See application file for complete search history.

(56) References Cited

U.S. PATENT DOCUMENTS

| | | | |
|---|---|---|---|
| 7,292,786 B1* | 11/2007 | Barbarossa et al. | 398/83 |
| 7,958,068 B2* | 6/2011 | Smith et al. | 706/20 |
| 8,472,728 B1* | 6/2013 | Chau et al. | 382/226 |
| 2007/0233435 A1* | 10/2007 | Bradski | 703/2 |
| 2007/0260563 A1* | 11/2007 | Fan et al. | 706/12 |
| 2012/0162384 A1* | 6/2012 | Vesely et al. | 348/47 |
| 2012/0179704 A1* | 7/2012 | Xu et al. | 707/766 |
| 2012/0239375 A1* | 9/2012 | Laxmanan et al. | 703/22 |
| 2014/0059047 A1* | 2/2014 | Laxmanan et al. | 707/737 |
| 2014/0257810 A1* | 9/2014 | Fujimura et al. | 704/243 |
| 2014/0307956 A1* | 10/2014 | Criminisi et al. | 382/159 |

OTHER PUBLICATIONS

Grabczewski, "Meta Learning in Decision Tree Induction", 2014, Studies in Computational Intelligence 498, pp. 1-108.*
Matas et al., "AdaBoost", Dec. 3, 2008, Centre for Machine Perception, pp. 1-136.*
Coadou, "Boosted Decision Trees in Theory", Jan. 30, 2014, ESIPAP, pp. 1-48.*
Amin Assareh, "Optimizing Decision Tree Ensembles for Gene-Gene Interaction Detection", Dec. 2012, pp. 1-148.*
Helge Voss, "Decision Trees and Boosting", Jan. 21, 2011, TMVA Workshop, pp. 1-30.*
Beck et al., "A Backward Adjusting Strategy for the C4.5 Decision Tree Classifier", Jul. 13, 2007, pp. 1-16.*

(Continued)

*Primary Examiner* — Jeffrey A Gaffin
*Assistant Examiner* — Paulinho E Smith
(74) *Attorney, Agent, or Firm* — Michael A. Springs

(57) ABSTRACT

In one embodiment, a system for enhancing predictive modeling includes an interface operable to receive a first dataset. The system may also include a processor communicatively coupled to the interface that is operable to generate a holdout dataset based on the first dataset. The processor may also train each of a plurality of boosting models in parallel using the first dataset, wherein for each of a number of iterations, training comprises: building a one-level binary decision tree to train a split-node variable; calculating an impurity of the split-node variable; and calculating an optimal split node, wherein the optimal split node is the split-node variable with a lowest impurity between the plurality of boosting models. The system may then determine a final model based on one of the plurality of boosting models that provides the lowest error rate when applied to the holdout dataset.

17 Claims, 7 Drawing Sheets

(56) References Cited

OTHER PUBLICATIONS

Mballo et al., "Decision Trees on Interval Valued Variables", 2005, The Electronic Journal of Symbolic Data Analysis, vol. 3 No. 1, pp. 1-11.*

Laxmanan et al., U.S. Appl. No. 14/594,523, Patent Application "Transforming Predictive Models".

K.B. Laxmanan, et al., U.S. Appl. No. 14/594,600, Non-final Office Action dated May 19, 2015.

* cited by examiner

Discrete AdaBoost

1. Start with weights $\omega_i = 1/N$, $i = 1,...,N$.
2. Repeat for $m = 1, 2,..., M$:
   (a) Fit the classifier $f_m(x) \in \{-1, 1\}$ using weights $\omega_i$ on the training data.
   (b) Computer $\text{err}_m = E_\omega[1_{(y \neq f_m(x))}]$, $c_m = \log((1 - \text{err}_m)/\text{err}_m)$.
   (c) Set $\omega_i \leftarrow \omega_i \exp[c_m 1_{(y_i \neq f_m(x_i))}]$, $i = 1, 2,..., N$, and renormalize so that $\Sigma_i \omega_i = 1$.
3. Output the classifier $\text{sign}[\Sigma_{m=1}^{M} c_m f_m(x)]$.

*FIG. 2A*

Real AdaBoost

1. Start with weights $\omega_i = 1/N$, $i = 1, 2,..., N$.
2. Repeat for $m = 1, 2,..., M$:
   (a) Fit the classifier to obtain a class probability estimate $p_m(x) = P_\omega(y = 1|x) \in [0, 1]$, using weights $\omega_i$ on the training data.
   (b) Set $f_m(x) \leftarrow \frac{1}{2} \log p_m(x)/(1 - p_m(x)) \in R$.
   (c) Set $\omega_i \leftarrow \omega_i \exp[-y_i f_m(x_i)]$, $i = 1, 2,..., N$, and renormalize so that $\Sigma_i \omega_i = 1$.
3. Output the classifier $\text{sign}[\Sigma_{m=1}^{M} f_m(x)]$.

*FIG. 2B*

Gentle AdaBoost

1. Start with weights $\omega_i = 1/N$, $i = 1, 2, ..., N$. $F(x) = 0$
2. Repeat for $m = 1, 2, ..., M$:
    (a) Fit the regression function $f_m(x)$ by weighted least-squares of $y_i$ to $x_i$ with weights $\omega_i$.
    (b) Update $F(x) \leftarrow F(x) + f_m(x)$.
    (c) Update $\omega_i \leftarrow \omega_i \exp(-y_i f_m(x_i))$ and renorormalize.
3. Output the classifier sign $[F(x)] = \text{sign}\left[\sum_{m=1}^{M} f_m(x)\right]$.

*FIG. 2C*

LogitBoost (two classes)

1. Start with weights $\omega_i = 1/N$, $i = 1, 2, ..., N$, $F(x)=0$ and probability estimates $p(x_i) = \frac{1}{2}$.
2. Repeat for $m = 1, 2, ..., M$:
    (a) Compute the working response and weights
    $$z_i = \frac{y_i^* - p(x_i)}{p(x_i)(1 - p(x_i))},$$
    $$\omega_i = p(x_i)(1 - p(x_i)).$$
    (b) Fit the function $f_m(x)$ by a weighted least-squares regression of $z_i$ to $x_i$ using weights $\omega_i$.
    (c) Update $F(x) \leftarrow F(x) + \frac{1}{2} f_m(x)$ and $p(x) \leftarrow (e^{F(x)})/(e^{F(x)} + e^{-F(x)})$.
3. Output the classifier sign $[F(x)] = \text{sign}\left[\sum_{m=1}^{M} f_m(x)\right]$.

*FIG. 2D*

ENHANCING CLASSIFICATION AND PREDICTION USING PREDICTIVE MODELING

TECHNICAL FIELD

This disclosure relates generally to modeling and more particularly to enhancing classification and prediction using predictive modeling.

BACKGROUND

For decades, enterprises have invested significant resources developing models to predict the likelihood of future outcomes. As interest in predictive modeling expanded, the number of the predictive models also expanded. Choosing, applying, and interpreting a predictive model presents challenges for enterprises.

SUMMARY OF THE DISCLOSURE

In accordance with the present disclosure, disadvantages and problems associated with predictive modeling may be reduced or eliminated.

In one embodiment, a system for enhancing predictive modeling includes an interface operable to receive a first dataset. The system may also include a processor communicatively coupled to the interface that is operable to generate a holdout dataset based on the first dataset. The processor may also train each of a plurality of boosting models in parallel using the first dataset, wherein for each of a number of iterations, training comprises: building a one-level binary decision tree to train a split-node variable; calculating an impurity of the split-node variable; and calculating an optimal split node, wherein the optimal split node is the split-node variable with a lowest impurity between the plurality of boosting models. The system may then determine a final model based on one of the plurality of boosting models that provides the lowest error rate when applied to the holdout dataset.

According to another embodiment, a method for enhancing predictive modeling includes receiving, at an interface, a first dataset and generating, with a processor, a holdout dataset based on the first dataset. The processor may also train each of a plurality of boosting models in parallel using the first data set, wherein for each of a number of iterations, the training includes: building a one-level binary decision tree to train a split-node variable; calculating an impurity of the split-node variable; and calculating an optimal split node, wherein the optimal split node is the split-node variable with a lowest impurity between the plurality of boosting models. The method may also include determining a final model, based on one of the plurality of boosting models that provides the lowest error rate when applied to the holdout dataset.

Certain embodiments of the invention may provide one or more technical advantages. One advantage of the present disclosure overcomes the traditional problem of predictive model interpretability. Another advantage of one embodiment allows for the running of multiple predictive models in parallel without increasing running time or computational resources. Embodiments of the present disclosure reduce the complexity of the algorithm used to find an optimal split node from $O(n^2)$ to $O(n)$, while implementing the algorithm in one computational data step.

A technical advantage of another embodiment may alleviate the "black box" nature associated with the output from a statistical model. Another technical advantage of the present disclosure illustrates the positive/negative relationship between each variable of a predictive model and the variable's effect on the model's output. Certain embodiments of the present disclosure may facilitate variable characteristic analysis based on the transformation of the trained predictive model to a linear model. One or more other technical advantages may be readily apparent to one skilled in the art from the figures, descriptions, and claims, included herein.

BRIEF DESCRIPTION OF THE DRAWINGS

For a more complete understanding of the present disclosure and for further features and advantages thereof, reference is now made to the following description taken in conjunction with the accompanying drawings, in which:

FIG. 2A illustrates an algorithm for training a Discrete Adaboost model;

FIG. 2B illustrates an algorithm for training a Real Adaboost model;

FIG. 2C illustrates an algorithm for training a Gentle Adaboost model;

FIG. 2D illustrates an algorithm for training a Logitboost model;

DETAILED DESCRIPTION

Glossary

Figure 1:
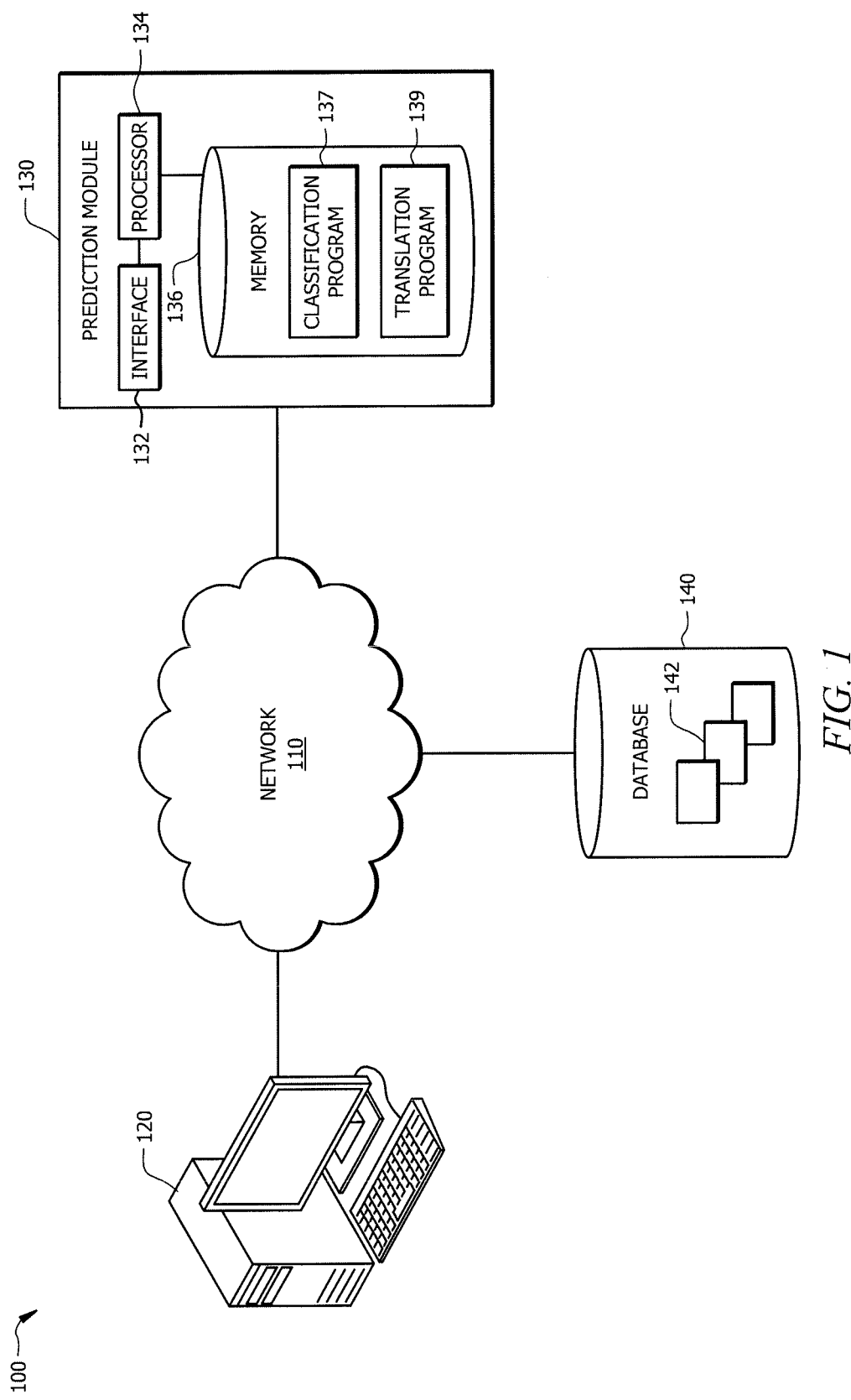
FIG. 1 illustrates an example system for training predictive models.

Application represents any suitable software or logic that allows a user to access information, provides information to a user, and/or facilitates interactions between components within a system or between users in a system.

Consumer represents a person that uses financial products or financial services, or, in reference to a commercial transaction, a consumer is the person or entity purchasing a good or service.

Dataset represents a collection of data. A dataset may include data from a single database or from multiple databases. A dataset may be broken into a training dataset, a validation dataset, and a testing dataset.

Financial Institution represents an individual, business, company, or organization that engages in financial activities and/or provides financial products and/or services, which may include, but are not limited to, banking and investment activities, such as maintaining accounts (e.g., transaction accounts, savings accounts, credit accounts, investment accounts, insurance accounts, portfolios, etc.), receiving deposits, crediting accounts, debiting accounts, extending credit to account holders, purchasing securities, providing insurance, and/or supervising a customer's portfolio.

Financial Product represents a savings account, a checking account, a credit card account, a loan account, a line of credit account, a debit account, a rewards account associated with a merchant, or any other financial product associated with a consumer.

Holdout Dataset represents a number of exhaustive and non-exhaustive cross-validation techniques for testing a predictive model. Example techniques for generating a holdout dataset include k-fold cross-validation, leave-p-out cross-validation, and random subsampling cross-validation.

Impurity represents an indication of how accurately a split-node variable classifies data. An impurity calculation may vary depending on the type boosting algorithm. For example the impurity of a node may be calculated using a Gini index calculation, entropy calculation, misclassification error calculation, or sum of squared error calculation.

Logic represents rules, algorithms, code, tables, and/or other suitable instructions embodied in a computer-readable storage medium for performing the described functions and operations of a component.

Memory represents a component of a kiosk operable to store data and information for use in provisioning a financial product. Memory may store financial products available for provisioning by the kiosk. The memory may store, either permanently or temporarily, data, operational software, or other information for the processor. The memory may include any one or a combination of volatile or nonvolatile local or remote devices suitable for storing information. For example, the memory may include random access memory (RAM), read only memory (ROM), magnetic storage devices, optical storage devices, or any other suitable information storage device or a combination of these devices.

Message represents any electronic transmission that carries data, such as a simple mail transfer protocol (SMTP) message, a short message service (SMS) message, a network packet, a computer file, an email, an HTML request, an XML request, or a combination of these or other suitable transmissions.

Network represents any suitable network operable to facilitate communication between the components of the system. The network may comprise a single network or multiple networks and may include any interconnecting system capable of transmitting audio, video, signals, data, messages, or any combination of the preceding. The network may include all or a portion of a public switched telephone network (PSTN), a public or private data network, a local area network (LAN), a metropolitan area network (MAN), a wide area network (WAN), a local, regional, or global communication or computer network, such as the Internet, a wireline or wireless network, an enterprise intranet, or any other suitable communication link, including combinations thereof, operable to facilitate communication between the components. The network may additionally include any combination of gateways, routers, hubs, switches, access points, base stations, wireless telephone systems and any other hardware, software or a combination thereof.

Network Interface represents any suitable device operable to receive information from the network, transmit information through the network, perform processing of information, communicate with other devices, or any combination of the preceding. The network interface represents any port or connection, real or virtual, including any suitable hardware and/or software, including protocol conversion and data processing capabilities, to communicate through a Local Area Network, Wide Area Network, or other communication system that allows the components within the system to exchange information.

Processor represents any hardware and/or software that operates to control and process information. A processor may be a programmable logic device, a microcontroller, a microprocessor, any suitable processing device, or any suitable combination of the preceding.

Split-Node Variable represents a node of a decision tree that can be used for classification or regression of a predicted outcome. The split-node variable may be used to sort data into two or more child nodes.

Vendor represents an individual, business, company, or other organization. An example of a vendor may include a Financial Institution.

Weight represents a measure of the importance each split-node variable receives once trained using a predictive model.

Workstation represents one or more laptops, personal computers, monitors, display devices, handheld devices, smartphones, servers, user input devices, or other suitable components for enabling users to monitor, administer, or otherwise interact with applications, networks, or other devices.

Embodiments of the present disclosure and its advantages are best understood by referring to FIGS. 1-6, like numerals being used for like and corresponding parts of the various drawings.

For decades, enterprises have invested significant resources developing models to predict the likelihood of future outcomes. As interest in predictive modeling expanded, the number of the predictive models also expanded. Choosing, applying, and interpreting a predictive model presents challenges for enterprises.

It is advantageous to provide a system and method that facilitate the classification and prediction of a sample using predictive modeling. For example, a prediction module may receive a first dataset from a database. The prediction module may then generate a holdout dataset based on the first dataset. The prediction module may then train a plurality of boosting models in parallel using the first dataset. During each iteration of the training process, each of the plurality of boosting models may build a one-level binary decision tree to train a split-node variable; calculate the impurity of the split-node variable; and calculate an optimum split-node variable between the plurality of boosting models. The optimal split-node variable may be the variable that produces the lowest impurity calculation. The prediction module may then determine a final model based on one trained boosting model that provides the lowest error rate when applied to the holdout dataset.

In another embodiment, it is advantageous to provide a system and method that facilitate the transformation of a predictive model. The prediction module may identify a plurality of split-node variables associated with the final model, with each split-node variable including a variable name, cutoff point, and weight. The prediction module may then aggregate the variables by variable name and cutoff point. The prediction module may then combine the weights of each variable having the same name and cutoff point. Prediction module may then create a linear model based on the combined predictor variables.

In certain embodiments, the plurality of boosting models trained by the prediction module include a Discrete Adaboost model, a Real Adaboost model, a Gentle Adaboost model, and a Logitboost model. For each boosting iteration, each boosting model may build a one-level binary tree (decision stump) as a variable (weak learner). By training each boosting module using one-level binary trees as weak learners, the prediction module may directly compare the disparate impurity methods used by each boosting model to determine the optimal split variable. Using this equivalency, the plurality of boosting models may run in a single computational data step (e.g., a SAS data step) without increasing running time or resources.

FIG. 1 illustrates an example system 100 for training predictive models. System 100 includes a prediction module 130 that communicates with a workstation 120 and a database 140 through a network 110.

Network 110 represents any suitable network operable to facilitate communication between the components of system 100. Network 110 may include any interconnecting system capable of transmitting audio, video, signals, data, messages, or any combination of the preceding. Network 110 may include all or a portion of a public switched telephone network (PSTN), a public or private data network, a local area network (LAN), a metropolitan area network (MAN), a wide area network (WAN), a local, regional, or global communication or computer network such as the Internet, a wireline or wireless network, an enterprise intranet, or any other suitable communication link, including combinations thereof operable to facilitate communication between the components.

Workstation 120 enables one or more users to monitor, administer, or otherwise interact with prediction module 130 or database 140. Workstation 120 may include one or more laptops, personal computers, monitors, display devices, handheld devices, smartphones, servers, user input devices, or other suitable components for enabling user input. Workstation 120 may itself include prediction module 130 and database 140.

In certain embodiments, workstation 120 may communicate with prediction module 130 to train and analyze predictive models. Workstation 120 may select which predictive models prediction module 130 trains using a dataset 142. Workstation 120 may also send a sample to prediction module 130 so that a trained predictive model can classify the sample and return a score to workstation 120. Workstation 120 may interact with prediction module 130 to analyze a scorecard created by translation program 139. The scorecard may be illustrate how variables of a trained statistical model affect the output score.

In another embodiment, workstation 120 may interact with database 140. For example, workstation 120 may update dataset 142 with new data or update database 140 to include new datasets for use with prediction module 130. Workstation 120 may also create variables for prediction module 130 to classify dataset 142.

Prediction module 130 represents any suitable components that facilitate predictive modeling. Prediction module 130 may also be any suitable components that create and facilitate the translation of a trained statistical model into a linear model and statistical scorecard. Prediction module 130 may include a network server, remote server, mainframe, host computer, workstation, web server, personal computer, file server, or any other suitable device operable to communicate with other devices and process data. In some embodiments, prediction module 130 may execute any suitable operating system such as IBM's zSeries/Operating System (z/OS), MS-DOS, PC-DOS, MAC-OS, WINDOWS, UNIX, OpenVMS, Linux, or any other appropriate operating systems, including future operating systems.

The functions of prediction module 130 may be performed by any suitable combination of one or more servers or other components at one or more locations. In the embodiment where the modules are servers, the servers may be public or private servers, and each server may be a virtual or physical server. The server may include one or more servers at the same or at remote locations. Prediction module 130 may also include any suitable component that functions as a server. In some embodiments, workstation 120 and database 140 may be integrated with prediction module 130 or they may operate as part of the same device or devices.

In the illustrated embodiment, prediction module 130 includes an interface 132, a processor 134, and a memory 136, which comprises a classification program 137 and a translation program 139.

Interface 132 represents any suitable device operable to receive information from network 110, transmit information through network 110, perform suitable processing of the information, communicate to other devices, or any combination thereof. For example, interface 132 may receive dataset 142 from database 140, which prediction module 130 may use to train statistical models and create predictive modeling programs. As another example, interface 132 may receive input from workstation 120 selecting a plurality of predictive modeling programs for classification program 137 to apply to dataset 142. As another example, interface 132 may communicate a model evaluation of the performance of prediction module 130 to workstation 120. In another embodiment, interface 132 may communicate a linear model created by translation program 139 to workstation 120, allowing a user to see how variables of dataset 142 influence the output of the trained predictive model. Interface 132 represents any port or connection, real or virtual, including any suitable hardware and/or software, including protocol conversion and data processing capabilities, to communicate through a LAN, WAN, or other communication system that allows prediction module 130 to exchange information with network 110, workstations 120, external database 140, or any other components of system 100.

Processor 134 communicatively couples interface 132 and memory 136 and controls the operation of prediction module 130. Processor 134 includes any hardware and software that operates to control and process information. In one embodiment, processor 134 may use dataset 142 to create a model validation technique for assessing the results of a statistical model. For example, processor 134 may generate a holdout dataset by randomly selecting a subset of data from dataset 142, and with the remainder data from dataset 142, creating a training dataset. Processor 134 may implement a number of other exhaustive and non-exhaustive cross-validation techniques for training and testing a statistical model such as k-fold cross-validation, leave-p-out cross-validation, and random subsampling cross-validation.

In another embodiment, processor 134 may train one or more statistical models using the training and holdout datasets. For example, processor 134 may be setup to train a Discrete Adaboost model and a Logitboost model in parallel. In another embodiment, processor 134 may determine the best variable to split dataset 142 by calculating an impurity of the data sample. For example, processor 134 may calculate the impurity of a sample using a Gini index calculation, entropy calculation, misclassification error calculation, and sum of squared error calculation. Processor 134 may then compare the impurity calculations across multiple statistical models to determine an optimal split-node variable. Processor 134 may also determine which statistical model provides the lowest error rate when applied to the holdout dataset. In certain embodiments, processor 134 may analyze a statistical model and create a linear model and scorecard. Processor 134 may also generate tabular and graphical model evaluations based on the performance of the predictive models.

In certain embodiments, processor 134 may apply advanced analytics software, such as Statistical Analysis System (SAS), to run classification program 137 and translation program 139. Processor 134 may be a programmable logic device, a microcontroller, a microprocessor, any suitable processing device, or any suitable combination of the preceding.

Memory 136 stores, either permanently or temporarily, data, operational software, other information for processor 134, other components of prediction module 130, or other components of system 100. Memory 136 includes any one or a combination of volatile or nonvolatile local or remote devices suitable for storing information. For example, memory 136 may include RAM, ROM, flash memory, magnetic storage devices, optical storage devices, network storage devices, cloud storage devices, solid state devices, or any other suitable information storage device or a combination of these devices. Memory 136 may store information in one or more databases, file systems, tree structures, any other suitable storage system, or any combination thereof. Furthermore, different information stored in memory 136 may use any of these storage systems (e.g., classification program 137 and translation program 139 may be stored in a relational database). Moreover, any information stored in memory 136 may be encrypted or unencrypted, compressed or uncompressed, and static or editable. Although illustrated as including particular modules, memory 136 may include any suitable information for use in the operation of prediction module 130.

In the illustrated embodiment, memory 136 includes classification program 137 and translation program 139.

Classification program 137 represents any machine-learning algorithm or algorithms that use data to generate a final model that may accurately predict and classify future data samples. For example, prediction module 130 may receive from database 140, dataset 142. Dataset 142 may include a holdout dataset and a training dataset, which trains one or more statistical models of classification program 137. In certain embodiments, the same training dataset is used for each statistical model. In other embodiments a different training dataset is used for each of a plurality of statistical models. Once trained, classification program 137 may select the statistical model that provides the lowest error rate when applied to the holdout dataset.

Classification program 137 may include a number of generalized statistical models to predict and classify data such as: Naive Bayes, a neural network, a support vector machine, random forests, boosted trees, classification and regression tress (CART), or multivariate adaptive regression splines (MARS) logistic regression. Classification program 137 may implement the statistical models in a number of ways. For instance, classification program 137 may include a number of boosting models that use one-level binary decision trees as weak learners. One-level binary decision trees may comprise a split node (stump), a left child node, and a right child node. The split-node variable may determine whether a data sample from dataset 142 should be classified into the left child node or the right child node. In certain embodiments, the split-node variable may classify data or conduct regression analysis.

In an exemplary embodiment, prediction module 130 may predict whether extending credit to an applicant would be profitable for an enterprise. Dataset 142 may include historic credit lending data from previous applicants such as each applicant's age, employment status, annual income, and profit made by the enterprise. Classification program 137 may train a number of predictive models on dataset 142 using a number of variables to classify the credit lending data. For example, variables may include whether the applicant is employed or unemployed, whether the applicant makes more than $50,000, and whether the enterprise made a profit of more or less than $1,000. Once trained, classification program 137 may determine which of the plurality of predictive models classified dataset 142 most accurately. Once prediction model 130 determines a final model, prediction module 130 may assess the likelihood that extending credit to a future applicant will result in profit for an enterprise.

In certain implementations, classification program 137 may apply a plurality of boosting models in parallel to produce an optimized model. In general, boosting is a way of combining the performance of many weak classifiers to produce a powerful ensemble. As discussed in more detail below, classification program 137 may train dataset 142 using a Adaboost model, a Realboost model, a Gentleboost model, and a Logitboost model. Classification program 137 may train the boosting algorithms in one computational data step, with each boosting algorithm using one-level binary decision trees as weak learners.

In certain embodiments, prediction module 130 may run for a certain number of iterations. The number of iterations may be decided using a number of factors. For example, prediction module 130 may determine a Kolmogorov-Smirnov (K-S) value for the predictive model applied to dataset 142. Once the K-S test reaches a certain value, prediction module 130 may stop the iterative process. In another example, prediction module 130 may calculate the error rate of a predictive model and stop the iterative process upon achieving a predetermined error rate.

Translation program 139 analyzes and transforms the trained boosting models created by classification program 137 to construct a linear model. Translation program 139 may also create a plurality of performance scorecards and model evaluations to describe the trained boosting algorithms. The scorecard and linear models created by translation program 139 may allow users to better understand and evaluate the boosting algorithms created by prediction module 130.

For example, prediction module 130 may determine whether a credit lending enterprise should extend credit to an applicant. Prediction module 130 may use dataset 142 to train a plurality of boosting models included in classification program 137. In certain embodiments, each boosting algorithm may employ one-level binary decision trees as weak learners. Once trained, classification program 137 may then select a final boosting model from the group. The final model may then include a collection of one-level binary trees that make up a binary forest. Once prediction module 130 creates a final model, the final model may accurately predict whether the enterprise should extend credit to a future applicant. To analyze how the final model arrives at an output score, prediction module 130 may use translation program 139 to transform the variables comprising the binary forest of the final model into a linear model, scorecard, or model evaluation.

In certain embodiments, translation program 139 may leverage the linear properties associated with one-level binary trees to transform the binary forest of the final model into an organized linear model. In certain embodiments, translation program 139 may create a linear model by analyzing how each split-node variable adjusted itself during the training process in order to achieve a single weight associated with each variable-cutoff combination. For example, each one-level binary tree of the final model comprises a split-node variable that separates data into a left child node and a right child node. Each one-level binary tree thus comprises a split-node variable name, a cutoff point, and a weight associated with the left and right child nodes. During the training process, multiple one-level binary decision trees may have the same split-node variable name and cutoff point, but due to the corrective nature of the boosting algorithm, have different weights associated with the left and right child nodes. Translation program 139 may combine the weights of the one-level binary trees that have the same split-node variable name and cutoff point.

In another embodiment, translation program 139 may generate a scorecard based on the transformed final model. For example, translation program 139 may generate a table showing each variable, cutoff point, and associated weight. In another example, translation program 139 may generate a plurality of if-then-else statements based on each variable, cutoff point, and associated weight. In another example, translation program may generate a model evaluation of the final model showing performance statistics such as the error rate of the model and the results of a Kolmogorov-Smirnov (K-S) test.

In certain embodiments, a non-transitory computer readable storage medium includes logic that is operable when executed by a processor to receive dataset 142 from database 140. The non-transitory computer readable storage medium may then apply classification program 137 and translation program 139 to dataset 142 and build a trained boosting model. The non-transitory computer readable storage medium may then use translation program 139 to provide a linear model, scorecard, or model evaluation of the trained boosting model.

A component of system 100 may include an interface, logic, memory, and other suitable elements. An interface receives input, sends output processes the input and/or output, and performs other suitable operations. An interface may comprise hardware and software. Logic performs the operation of the component. For example, logic executes instructions to generate output from input. Logic may include hardware, software and other logic. Logic may be encoded in one or more non-transitory, tangible media, such as a computer readable medium or any other suitable tangible medium, and may perform operations when executed by a computer. Certain logic, such as a processor, may manage the operation of a component. Examples of a processor include one or more computers, one or more microprocessors, one or more applications, and other logic.

Modifications, additions, or omissions may be made to system 100 without departing from the scope of the invention. For example, dataset 142 may include a plurality of variables (weak learners) that are already associated with the data points. In other embodiments, workstation 120 may create the weak learners associated with dataset 142. In certain embodiments, classification program 137 and translation program 139 may be the same program. In other embodiments, workstation 120 may send prediction module 130 a trained model for translation program 139 to transform. Any suitable logic may perform the functions of system 100 and the components within system 100.

FIGS. 2A-D illustrate the respective training methods that classification program 137 may employ for Adaboost, Realboost, Gentleboost, and Logitboost.

FIG. 2A illustrates an algorithm for training a Discrete Adaboost model. Adaboost or Adaptive Boosting is a classification technique where a plurality of weak classifiers are trained using a dataset. Each sample in the dataset is assigned a weight to indicate its probability of being applied to a classifier. During each iteration, if a sample from the dataset is correctly classified, then its probability of being selected is lowered, otherwise its probability is boosted. Another weak classifier is then added to the ensemble and the reweighted samples are used for the next iteration. The subsequently added weak classifiers are trained based on the re-weighted samples, giving greater focus to the misclassified samples. Once the iterations are complete, the Adaboost model may predict an outcome of a new sample using the ensemble of weak learners, taking into account each weak learner's respective weight, to arrive at a consensus output.

In certain embodiments, the Discrete Adaboost technique is a binary classification technique that encodes the dependent variable according to equation (1):

$$f(x) = \begin{cases} -1, & p_{1L} \leq 0.5 \text{ on left or } p_{1R} \leq 0.5 \text{ on right} \\ 1, & p_{1L} > 0.5 \text{ on left or } p_{1R} > 0.5 \text{ on right} \end{cases} \quad (1)$$

FIG. 2B illustrates an algorithm for applying a Real Adaboost model. Real Adaboost or Realboost is a variant of Adaboost. Instead of encoding the binary dependent variable to a [−1, +1] scheme, Realboost is generalized to produce a real value prediction. Realboost fits the classifier to obtain a class probability estimate. In the binary response case, Real Adaboost may encode the dependent variable to half the logit transform of its value as shown in equation (2):

$$f(x) = \begin{cases} \frac{1}{2} \log \frac{p_{1L}}{1-p_{1L}}, & \text{left} \\ \frac{1}{2} \log \frac{p_{1L}}{1-p_{1R}}, & \text{right} \end{cases} \quad (2)$$

FIG. 2C illustrates an algorithm for training a Gentle Adaboost model and FIG. 2D illustrates an algorithm for training a Logitboost model. Gentleboost and Logitboost are two other variations of Adaboost that involve the direct optimization of the binomial log-likelihood. Gentleboost and Logitboost differ from Realboost and Discrete Adaboost by applying additive logistic regression models to the classification process. Gentleboost and Logitboost can be used to predict the probability of occurrence of an outcome given that the output values are adjusted between zero and one. Gentleboost alters the Adaboost technique by assigning less weight to outlier data samples, while Logitboost chooses the weak learners that minimize the weighted least-squares error of the sample. In certain embodiments, Gentleboost and Logitboost encode binary dependent variables according to equation (3):

$$f(x) = \begin{cases} \overline{y_L}, & \text{left} \\ \overline{y_R}, & \text{right} \end{cases} \quad (3)$$

Classification program 137 may determine the optimal split-point variable to classify dataset 142 by comparing the impurity or error of each split-node variable across each boosting method. In certain embodiments, prediction module 130 may apply a Gini Impurity Index to the Discrete Adaboost and Realboost models and a Sum of Square Error (SSE) calculation to the Gentleboost and Logitboost models. Classification program 137 may determine the optimal split node between the four boosting algorithms by comparing the respective impurity or error calculations. The direct comparison of the impurity calculations is possible in the binary response case due to the Gini Impurity calculation being a special case of the Sum of Square Error. Equations (4)-(11) show the equivalency between SSE and Gini Impurity in the binary response case, which allows for direct comparison of the split-node variable:

$$SSE = \Sigma_{i \in L} w_i (y_i - \overline{y_L})^2 + \Sigma_{i \in R} w_i (y_i - \overline{y_R})^2 \quad (4)$$

$$\Sigma_{i \in L} w_i y_i^2 - 2\overline{y_L}^2 w_L + \overline{y_L}^2 w_L + \Sigma_{i \in R} w_i y_i^2 - 2\overline{y_R}^2 w_R + \overline{y_R}^2 w_R \quad (5)$$

$$SSE = \sum_{i \in L} w_i(y_i - \overline{y_L})^2 + \sum_{i \in R} w_i(y_i - \overline{y_R})^2 \quad (4)$$

$$= \sum_{i \in L} w_i y_i^2 - 2\overline{y_L}^2 w_L + \overline{y_L}^2 w_L + \quad (5)$$

$$\sum_{i \in R} w_i y_i^2 - 2\overline{y_R}^2 w_R + \overline{y_R}^2 w_R$$

$$= \sum_i w_i y_i^2 - \frac{\left(\sum_{i \in L} w_i y_i\right)^2}{w_L} - \frac{\left(\sum_{i \in R} w_i y_i\right)^2}{w_R} \quad (6)$$

Thus, minimizing the SSE is equivalent to maximizing equation (7):

$$\frac{\left(\sum_{i \in L} w_i y_i\right)^2}{w_L} + \frac{\left(\sum_{i \in R} w_i y_i\right)^2}{w_R} \quad (7)$$

Wherein:
$w_L = \sum_{i \in L} w_i$
$w_R = \sum_{i \in R} w_i$
$\overline{y_L} = \sum_{i \in L} w_i y_i / w_L$
$\overline{y_R} = \sum_{i \in R} w_i y_i / w_R$ Furthermore, in the binary response case it is possible to do a linear transform so that $y \in \{0,1\}$. Minimizing the SSE is thus equivalent to maximizing equation (8):

$$\frac{w_{1L}^2}{w_L} + \frac{w_{1R}^2}{w_R} \quad (8)$$

Wherein:
$w_{1L}$ is the sum of weights of y=1 on the left; and
$w_{1R}$ is the sum of weights of y=1 on the right.

The Gini Impurity criteria for the binary response case is shown in equation (9):

$$Gini = \frac{w_{1L}}{w_L} \cdot \frac{w_L - w_{1L}}{w_L} \cdot \frac{w_L}{w} + \frac{w_{1R}}{w_R} \cdot \frac{w_R - w_{1R}}{w_R} \cdot \frac{w_R}{w} \quad (9)$$

To minimize the Gini Index is equivalent to equation (10):

$$\frac{w_{1L}(w_L - w_{1L})}{w_L} + \frac{w_{1R}(w_R - w_{1R})}{w_R} = \quad (10)$$

$$w_{1L} + w_{1R} - \frac{w_{1L}^2}{w_L} - \frac{w_{1R}^2}{w_R} = w_1 - \frac{w_{1L}^2}{w_L} - \frac{w_{1R}^2}{w_R}$$

Thus, minimizing the Gini Impurity is equivalent to maximizing equation (11):

$$\frac{w_{1L}^2}{w_L} + \frac{w_{1R}^2}{w_R} \quad (11)$$

By training the Discrete Adaboost, Real Adaboost, Gentle Adaboost, and Logicboost models using one-level binary trees, prediction module 130 may directly compare the results of the SSE and Gini Impurity calculations of equations (8) and (11), respectively. This direct comparison of Gini Impurity and SSE alleviates the need to train the various boosting methods sequentially, reducing the running time and memory needed to train the models. Prediction module 130 may then determine a final model based on which of the plurality of boosting models provides the lowest error rate when applied to a holdout dataset.

Figure 3:
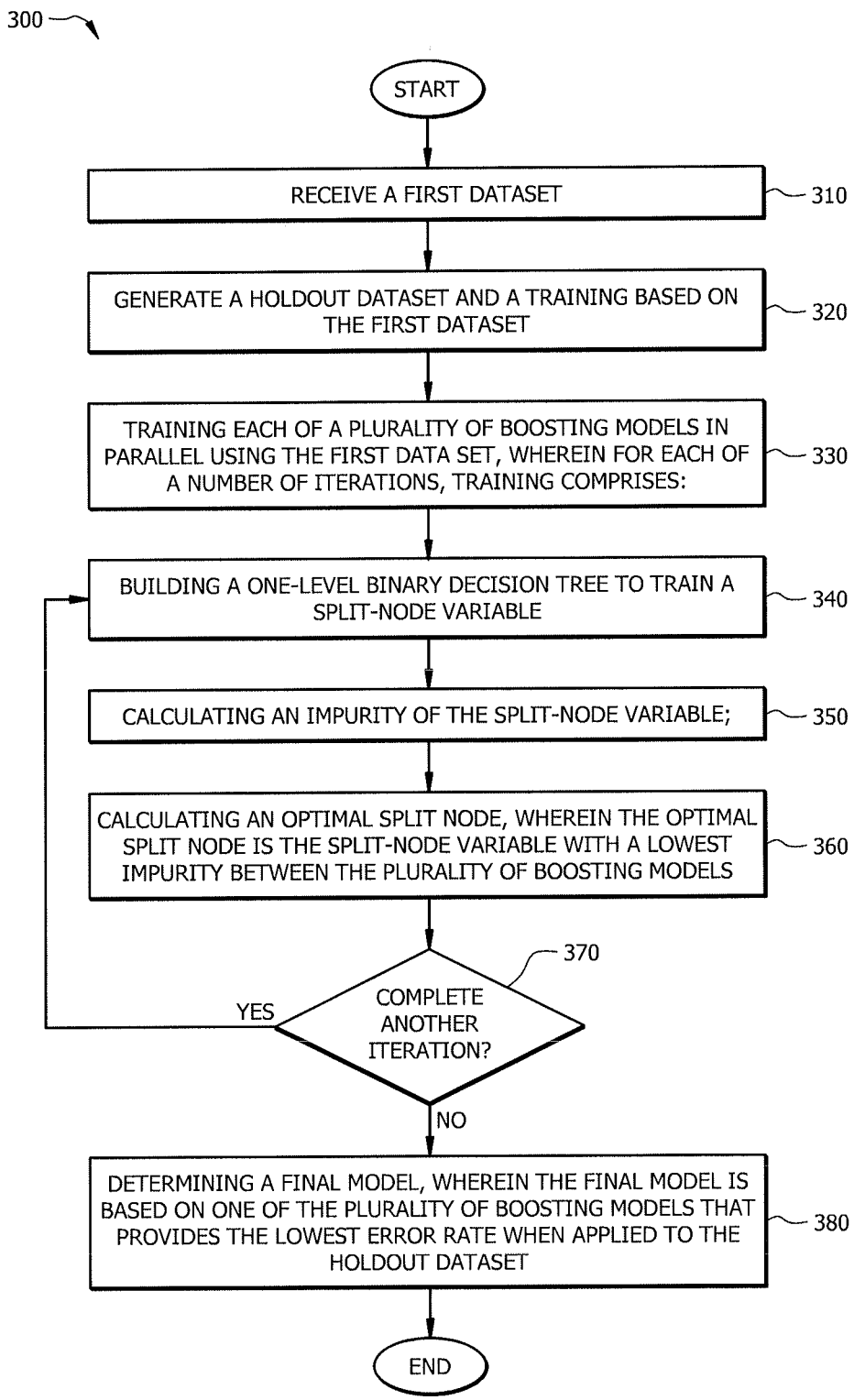
FIG. 3 illustrates a flowchart illustrating a method of performing boosting.

FIG. 3 is a flowchart illustrating a method of performing boosting. At step 310, prediction module 130 receives dataset 142 from database 140. Database 140 may include one or more datasets for a number of different scenarios. For example, dataset 142 may contain information for credit scoring. The credit scoring data may be tailored for consumer credit lending. In some embodiments, the credit scoring data may be tailored for commercial lending. Dataset 142 may include continuous or categorical data. In another embodiment, dataset 142 may include data on home prices. Home data may include information on pricing, location, square feet, and school districts.

At step 320, prediction module 130 generates a holdout dataset based on dataset 142. Prediction module 130 may employ a number of validation techniques in order to train a boosting model and validate the trained model's accuracy. Processor 134 may generate a holdout dataset by randomly selecting a subset of data from dataset 142, and with the remainder data from dataset 142, creating a training dataset.

At step 330, prediction module 130 uses classification program 137 to train each of a plurality of boosting models in parallel using the training dataset. In some embodiments, classification program 137 may be setup to train Discrete Adaboost, Real Adaboost, Gentle Adaboost, and Logicboost models using the training dataset.

At step 340, for each of a number of iterations, each boosting module builds a one-level binary decision tree to train a split-node variable. A one-level binary tree, or decision stump, is a decision tree with a split node connected to two terminal nodes, the left child node and the right child node. A decision stump predicts an outcome based on the value of an input.

At step 350, prediction module 130 calculates the impurity of the split-node variable. Prediction module 130 may employ a number of methods to calculate the impurity of the split-node variable depending on the boosting method applied. For instance, impurity may be calculated using a Gini Impurity calculation if classification program 137 uses a Discrete Adaboost model or a Real Adaboost model. The impurity may be calculated using a Sum of Square Error if classification program 137 uses a Gentle Adaboost or Logitboost model.

At step 360, prediction module 130 calculates an optimal split node, wherein the optimal split node is the split-node variable with a lowest impurity between the plurality of boosting modules. In certain embodiments classification program 137 may unify implementations of the plurality of boosting modules trained by dataset 142 by comparing the equivalent impurity calculations as discussed above.

At step 370, prediction module 130 determines whether to complete another training iteration. If prediction module 130 determines that another iteration is required, then the sequence returns to step 340. If prediction module 130 determines that another iteration is unnecessary, then the sequence proceeds to step 380.

At step 380, prediction module 130 may determine a final model, wherein the final model is based on which of the plurality of boosting models provides the lowest error rate when applied to the holdout dataset.

Various embodiments may perform some, all, or none of the steps described above. For example, certain embodiments may omit steps 310 and 320 under certain conditions. Dataset 142 may already be divided into a holdout dataset and a training dataset. In another example, prediction module 130 may already contain a plurality of trained boosting models and may only need to determine a final model based on a holdout dataset. While discussed as prediction module 130 performing these steps, any suitable component of system 100 may perform one or more steps of the method.

Figure 4:
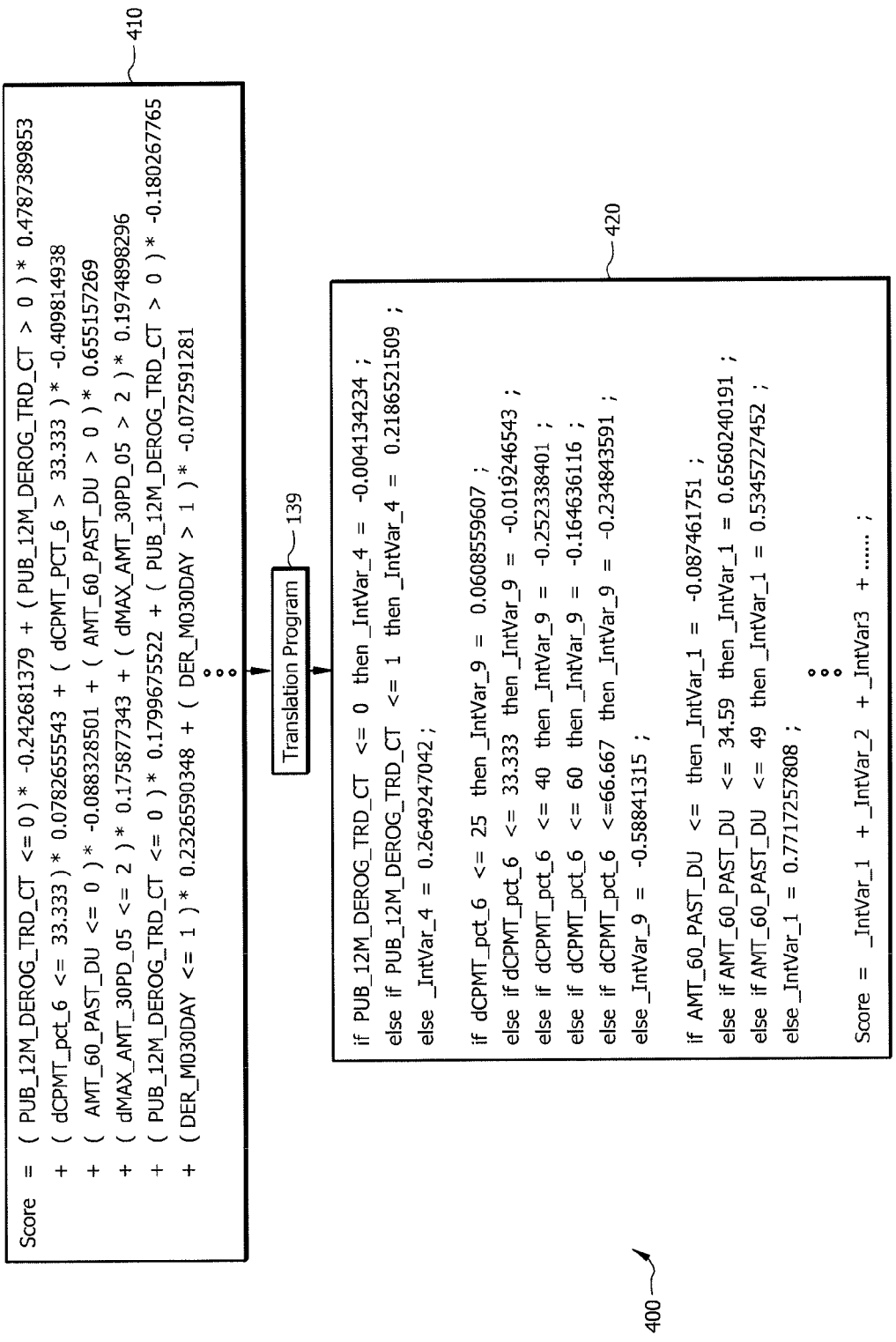
FIG. 4 illustrates a process of transforming a trained boosting model into a linear model.

FIG. 4 illustrates a process of transforming a trained boosting model into a linear model. Translation process 400 includes translation program 139, trained boosting model 410, and translated boosting model 420.

Trained boosting model 410 illustrates an example embodiment of a boosting model trained on dataset 142. In the illustrated embodiment, trained boosting model 410 includes a plurality of one-level binary trees. Each one-level binary tree may include a split-node variable, cutoff point, and weight. For example, the first row of trained boosting model 410 is the result of the one-level binary decision tree with the split-node variable "PUB_12M_DEROG_TRD_CT," and cutoff point "0." In certain embodiments, a sample that is less than or equal to zero is sent to the left child node and the corresponding weight "−0.242681379" is added to the final score. If the sample is greater than zero, the sample goes to the right child node and the corresponding weight "0.4787389853" is added to the final output score. As the final model classifies a plurality of inputs associated with a sample, the output score may be the summation of each applicable weight associated with a child node.

Due to the corrective nature of the boosting process and the use of one-level binary trees, the final model may include multiple one-level binary trees containing the same variable name and cutoff point, but with different weights. For example, in the illustrated embodiment, although rows one and five of trained boosting model 410 contain the same split-node variable and cutoff point, they lead to different weights. Depending on the size of dataset 142 and the number of split-node variables, trained boosting model 410 may be significant in length, rendering it difficult to understand how a specific variable and cutoff point affects the score. Due to the corrective nature of the training process, there may be a significant number of repeated one-level binary trees in trained boosting model 410.

Translation program 139 may transform trained boosting model 410 into a more user-friendly algorithm. In certain embodiments, translation program 139 recognizes that trained boosting model 410 comprises a plurality of one-level binary trees making up a binary forest. Translation program 139 may then aggregate the variables by variable name and cutoff point. Translation program 139 may then combine the weights of each of the plurality of variables having the same variable name and cutoff point. Once translation program 139 aggregates the binary forest of trained boosting model 410, translation program 139 may create a linear model based on the combined variables.

Translated boosting model 420 illustrates an example embodiment of trained boosting model 410 transformed using translation program 139. In the illustrated embodiment, translated boosting model 420 is in the form of a plurality of "if-then-else" statements. Each if-then-else statement may correspond to a split-node variable of trained boosting model 410. Each "else" statement in the if-then-else routine may correspond to a different cutoff point associated with the split-node variable. If a condition of the if-then-else statement is met, the combined weight associated with the variable and cutoff point is assigned to a placeholder variable associated with each split-node variable. In certain embodiments, a placeholder variable for each split-node variable is created by translation program 139. The score of translated boosting model 420 may be the summation of each placeholder variable. In this manner, users may analyze translated boosting model 420 and understand the positive/negative relationship between each split-node variable and the final score.

In an exemplary embodiment, an applicant may request a line of credit from a credit lending enterprise. The enterprise may request a plurality of information from the applicant that the enterprise can enter into prediction module 130 to determine if it would be profitable to extend the applicant credit. Translated boosting model 420 may determine a score based on the information provided by the applicant that indicates whether the enterprise should extend the applicant credit. By using translated boosting model 420 instead of trained boosting model 410, the enterprise may determine which variables have the most influence on the score. For example, the enterprise may only extend credit to applicants having a score greater than zero. If the applicant's score is less than zero, the enterprise may evaluate each negative placeholder variable to determine which split-node variables are most influential to the negative score. In this manner, the enterprise may make a more informed decision when offering or denying credit to an applicant. In certain embodiments, the enterprise may use the results of translated boosting model 420 to offer applicants advice on how they may become eligible for credit.

Figure 5:
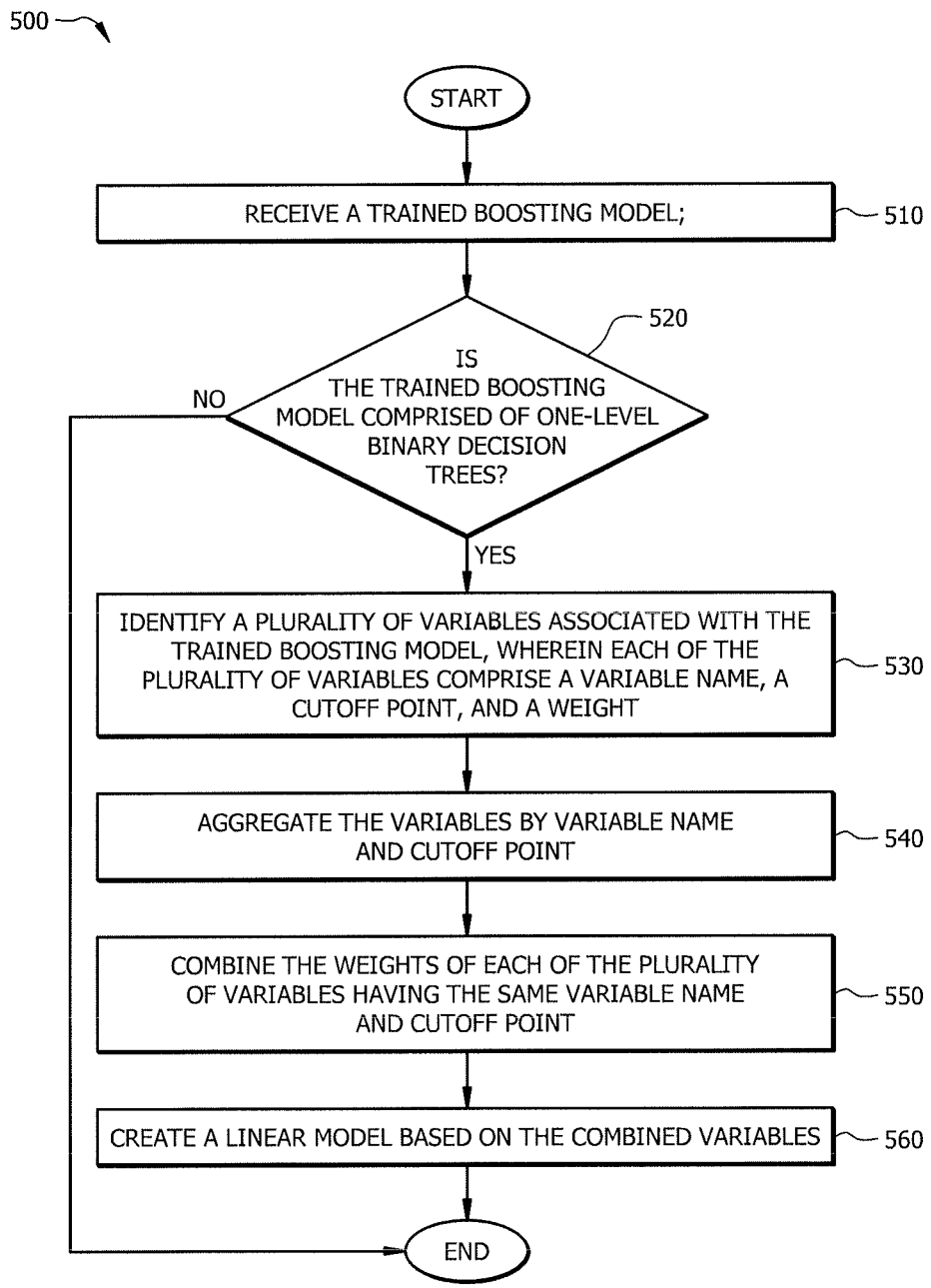
FIG. 5 illustrates a flowchart illustrating a method of translating a trained boosting model.

FIG. 5 illustrates a flowchart illustrating a method of translating a trained boosting model.

At step 510, translation program 139 receives a trained boosting model. In certain embodiments, prediction module 130 uses classification program 137 to train a plurality of boosting models using dataset 142. Translation program 139 may then receive one or more of the plurality of trained boosting models from classification program 137. For example, classification program 137 may determine which of the plurality of trained boosting models produces the lowest error rate on a holdout dataset created from dataset 142. Translation program 139 may then receive the trained boosting program that produced the lowest error rate on the holdout dataset.

At step 520, translation program 139 determines whether the trained boosting model is comprised of one-level binary decision trees. If the trained boosting module uses one-level binary decision trees as weak learners then the sequence proceeds to step 530, if not the sequence ends.

At step 530, translation program 139 identifies a plurality of variables associated with the trained boosting model, wherein each of the plurality of variables comprises a variable name, a cutoff point, and a weight.

At step 540, translation program 139 aggregates the variables by variable name and cutoff point. For example, trained boosting model 410 includes a plurality of one-level binary trees, with each row representing a split-node variable. Based on the number of split-node variables and size of dataset 142, trained boosting model 410 may include a number of repeated variables and cutoff points.

At step 550, translation program 139 combines the weights of each of the plurality of variables having the same variable name and cutoff point. For example, Due to the corrective nature of the boosting process and the use of one-level binary trees trained boosting algorithm 410 may include multiple points that the same variable name and cutoff point, but with different weights. Due to the linear nature of one-level binary trees, translation program 139 may add these weights together creating a single weight for each respective variable name and cutoff point.

At step 560, translation program 139 creates a linear model based on the combined variables. Once the weights of the variables having the same name and cutoff point are combined, translation program 139 may organize translated boosting model 420 in a plurality of ways. In certain embodiments translation program 139 may create a linear model, in other embodiments, translation program 139 may generate a program in an if-then-else format.

Various embodiments may perform some, all, or none of the steps described above. For example, certain embodiments may omit step 520 under certain conditions. For example, classification program 137 may indicate that the trained boosting model uses one-level binary trees as classifiers without translation program 139 needing to run its own analysis. In certain embodiments, translation program 139 may generate a scorecard of the variables used to compute the final score. Furthermore, certain embodiments may perform these steps in a different order or in parallel.

Figures 6A, 6B:
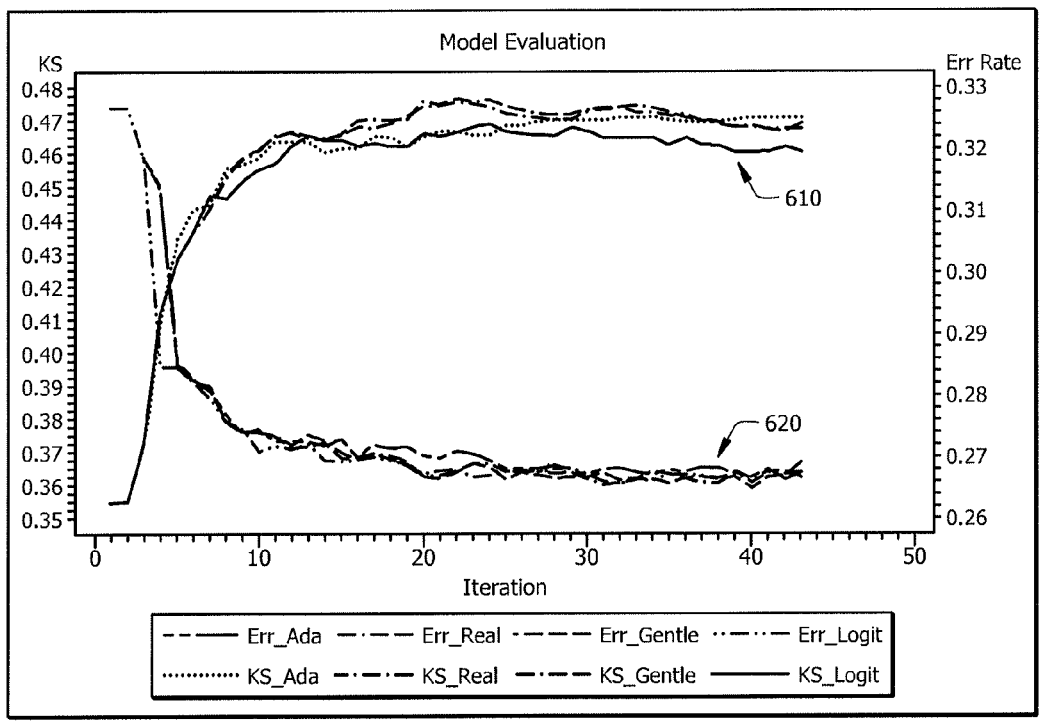
FIG. 6A illustrates an example embodiment of a model evaluation.
FIG. 6B illustrates an example embodiment of a contribution scorecard for a trained boosting model.

FIG. 6A illustrates an example embodiment of a model evaluation. In the illustrated embodiment, model evaluation chart 600a is a convergence chart of K-S and error rates of each boosting model trained by classification program 137. Model evaluation chart 600a charts the K-S value 610 and error rate 620 for a number of iterations. In certain embodiments, translation program may generate a model evaluation chart 600a using the final model trained by classification program 137.

FIG. 6B illustrates an example embodiment of a performance scorecard for a trained boosting model. In certain embodiments, translation program 139 generates a table ranking each variable of the final model by their total variance contributions in all one-level binary trees. Once each variable is ranked by its contribution to the final score, the most influential variables may be selected for further analysis. In the illustrated embodiment, the contribution scorecard lists the type of boosting algorithm used by the final model, and ranks each variable name by its total variance contribution.

For example, an enterprise may input a credit applicant's data into prediction module 130 to be applied to a final model that outputs a score indicating whether the enterprise should extend the applicant credit. Translation program may generate a contribution scorecard listing each variable and each variables total contribution to the score. This table may allow the enterprise, to see which variables are most influential to the applicant's credit lending score.

Certain embodiments of the invention may provide one or more technical advantages. One advantage of the present disclosure overcomes the traditional problem of statistical model interpretability. A technical advantage of one embodiment may allow for the running of multiple statistical models in parallel without increasing running time or computational resources. Some embodiments of the present disclosure reduce the complexity of the searching algorithm from $O(n^2)$ to $O(n)$, and implement the algorithm in one computational data step making it possible to run the statistical model in real time.

A technical advantage of another embodiment may alleviate the "black box" nature associated with the output from a statistical model. Another technical advantage of one embodiment may illustrate the positive/negative relationship between each predictor and the output of a statistical model. Certain embodiments of the present disclosure may facilitate variable characteristic analysis based on the translation of the statistical model. One or more other technical advantages may be readily apparent to one skilled in the art from the figures, descriptions, and claims, included herein.

Although the present disclosure has been described with several embodiments, a myriad of changes, variations, alterations, transformations, and modifications may be suggested to one skilled in the art, and it is intended that the present disclosure encompass such changes, variations, alterations, transformations, and modifications as fall within the scope of the appended claims.

What is claimed is:

1. A method for enhancing predictive modeling, comprising:
    receiving, at an interface, a first dataset;
    generating, with a processor, a holdout dataset based on the first dataset;
    training, with the processor, each of a plurality of boosting models in parallel using the first data set, wherein for each of a number of iterations, training comprises:
        building a one-level binary decision tree to train a split-node variable;
        calculating an impurity of the split-node variable;
        calculating an optimal split node, wherein the optimal split node is the split-node variable with a lowest impurity between the plurality of boosting models; and
        calculating a total variance for the split node variable;
    determining a final model, based on one of the plurality of boosting models that provides a lowest error rate when applied to the holdout dataset.

2. The method of claim 1, wherein the plurality of boosting models includes Discrete Adaboost, Real Adaboost, Gentle Adaboost, and Logitboost.

3. The method of claim 2, wherein calculating an impurity of the split-node variable comprises:
    calculating a Gini impurity index on the split-node variable trained using the Discrete Adaboost model;
    calculating a Gini impurity index on the split-node variable trained using the Real Adaboost model;
    calculating a Sum of Squared Error on the split-node variable trained using the Gentle Adaboost model; and
    calculating a Sum of Squared Error on the split-node variable trained using the Logitboost model.

4. The method of claim 1, wherein training each of a plurality of boosting methods in parallel using the first data set further comprises:
    calculating a Kolmogorov-Smirnov (K-S) value; and
    terminating the iterations when the K-S value reaches a predetermined K-S value.

5. The method of claim 1, wherein training each of a plurality of boosting methods in parallel using the first data set further comprises:
    calculating an error rate; and
    terminating the iterations when the boosting model achieves a predetermined error rate.

6. The method of claim 1, wherein calculating an optimal split node is implemented in one computational data step.

7. A non-transitory computer readable storage medium comprising logic, the logic operable, when executed by a processor, to:
    receive a first dataset;
    generate a holdout dataset based on the first dataset;
    train each of a plurality of boosting models in parallel using the first data set, wherein for each of a number of iterations, training comprises:
        building a one-level binary decision tree to train a split-node variable;
        calculating an impurity of the split-node variable;

calculating an optimal split node, wherein the optimal split node is the split node variable with a lowest equivalent impurity between the plurality of boosting models; and calculating a total variance for the split-node variable;

determine a final model based on one of the plurality of boosting models that provides a lowest error rate when applied to the holdout dataset.

8. The non-transitory media of claim 7, wherein the plurality of boosting models includes Discrete Adaboost, Real Adaboost, Gentle Adaboost, and Logitboost.

9. The non-transitory media of claim 8, wherein calculating an impurity of the split node comprises:

calculate a Gini impurity index on the split-node variable trained using the Discrete Adaboost model;

calculate a Gini impurity index on the split-node variable trained using the Real Adaboost model;

calculate a Sum of Squared Error on the split-node variable trained using the Gentle Adaboost model; and calculate a Sum of Squared Error on the split-node variable trained using the Logitboost model.

10. The non-transitory media of claim 7, wherein training each of a plurality of boosting methods in parallel using the first data set further comprises:

calculating a Kolmogorov-Smirnov (K-S) value; and terminating the iterations when the K-S value reaches a predetermined K-S value.

11. The non-transitory media of claim 7, wherein training each of a plurality of boosting methods in parallel using the first data set further comprises:

calculate an error rate; and terminate the iterations when the boosting model achieves a predetermined error rate.

12. The non-transitory media of claim 7, wherein calculating an optimal split node is implemented in one computational data step.

13. A system for enhancing predictive modeling, comprising:

an interface operable to:
receive a first dataset;

a processor communicatively coupled to the interface and operable to:
generate a holdout dataset based on the first dataset;

train each of a plurality of boosting models in parallel using the first dataset, wherein for each of a number of iterations, training comprises:

building a one-level binary decision tree to train a split-node variable;

calculating an impurity of the split-node variable;

calculating an optimal split node, wherein the optimal split node is the split-node variable with a lowest impurity between the plurality of boosting models; and calculating a total variance for the split node variable;

determining a final model based on one of the plurality of boosting models that provides the lowest error rate when applied to the holdout dataset.

14. The system of claim 13, wherein the plurality of boosting models includes Discrete Adaboost, Real Adaboost, Gentle Adaboost, and Logitboost.

15. The system of claim 14, wherein calculating an impurity of the split-node variable comprises:

calculating a Gini impurity index on the split-node variable trained using the Discrete Adaboost model;

calculating a Gini impurity index on the split-node variable trained using the Real Adaboost model;

calculating a Sum of Squared Error on the split-node variable trained using the Gentle Adaboost model; and calculating a Sum of Squared Error on the split-node variable trained using the Logitboost model.

16. The system of claim 13, wherein training each of a plurality of boosting methods in parallel using the first data set further comprises:

calculating a Kolmogorov-Smirnov (K-S) value; and terminating the iterations when the KS value reaches a predetermined KS value.

17. The system of claim 13, wherein training each of a plurality of boosting methods in parallel using the first data set further comprises:

calculating an error rate; and terminating the iterations when the boosting model achieves a predetermined error rate.

* * * * *